(12) United States Patent
Leong et al.

(10) Patent No.: US 10,153,734 B1
(45) Date of Patent: Dec. 11, 2018

(54) CONFIGURABLE RADIO FREQUENCY POWER AMPLIFIER AND METHOD THEREOF

(71) Applicant: Realtek Semiconductor Corp., Hsinchu (TW)

(72) Inventors: Poh-Boon Leong, Pleasanton, CA (US); Chia-Liang (Leon) Lin, Fremont, CA (US)

(73) Assignee: REALTEK SEMICONDUCTOR CORP., Hsinchu (TW)

(*) Notice: Subject to any disclaimer, the term of this patent is extended or adjusted under 35 U.S.C. 154(b) by 0 days.

(21) Appl. No.: 15/615,899

(22) Filed: Jun. 7, 2017

(51) Int. Cl.
| | |
|---|---|
| *H03F 1/22* | (2006.01) |
| *H03F 1/02* | (2006.01) |
| *H03F 3/68* | (2006.01) |
| *H03F 3/42* | (2006.01) |
| *H03G 3/30* | (2006.01) |
| *H03G 1/00* | (2006.01) |
| *H03F 3/21* | (2006.01) |

(52) U.S. Cl.
CPC ............ *H03F 1/0211* (2013.01); *H03F 3/21* (2013.01); *H03F 3/42* (2013.01); *H03F 3/68* (2013.01); *H03G 1/0088* (2013.01); *H03G 3/30* (2013.01); *H03G 3/3042* (2013.01)

(58) Field of Classification Search
CPC . H03F 1/22; H03F 1/223; H03F 1/226; H03F 3/68
USPC .................................................. 330/295, 311
See application file for complete search history.

(56) References Cited

U.S. PATENT DOCUMENTS

| | | | |
|---|---|---|---|
| 9,246,451 B2 | 1/2016 | Sutardja et al. | |
| 2016/0079935 A1* | 3/2016 | Seong ..................... | H03F 1/565 330/295 |

* cited by examiner

*Primary Examiner* — Steven J Mottola
(74) *Attorney, Agent, or Firm* — McClure, Qualey & Rodack, LLP (57) ABSTRACT

An apparatus includes: an input coupler configured to receive an input voltage and output a first coupled voltage and a second coupled voltage in accordance with a first bias voltage and a second bias voltage, respectively; a stacked amplifier pair configured to receive the first coupled voltage and the second coupled voltage and output a first output voltage and a second output voltage in accordance with a first DC voltage, a second DC voltage, and a third DC voltage; and an output combiner configured to establish a combined output voltage in accordance with a combination of the first output voltage and the second output voltage, wherein the stacked amplifier pair includes a first amplifier operating with a power supplied from the second DC voltage to the first DC voltage and a second amplifier operating with a power supplied from the third DC voltage to the second DC voltage.

20 Claims, 5 Drawing Sheets

CONFIGURABLE RADIO FREQUENCY POWER AMPLIFIER AND METHOD THEREOF

BACKGROUND OF THE INVENTION

Field of the Invention

The present invention generally relates to power amplifier circuits and more particularly power amplifier circuits having lower distortion.

Description of Related Art

Power amplifiers are widely used in many applications. A prior art power amplifier utilizes either an NMOS (n-channel metal oxide semiconductor) or a PMOS (p-channel metal oxide semiconductor) transistor as a gain device configured as a common-source amplifier. In a typical configuration, when an NMOS (PMOS) transistor is used as the common-source amplifier, a gate terminal of the NMOS (PMOS) transistor is coupled to an input voltage, a source terminal of the NMOS (PMOS) transistor is connected to a ground (power) node, and a drain terminal of the NMOS (PMOS) transistor is coupled to a power (ground) node via an inductor. An output of the common-source amplifier is tapped at the drain terminal of the NMOS (PMOS) transistor.

A first issue of the prior art power amplifier is that, there is an appreciable second order distortion in the output. A second issue is that, while a mean value of the drain-to-source voltage of the transistor (either NMOS or PMOS) is approximately equal to a power supply voltage (which is a voltage difference between the power node and the ground node), a peak value of the drain-to-source voltage can be twice as large when the power amplifier reaches a full output capacity. A high drain-to-source voltage causes a high stress on a transistor and might damage the transistor. For the transistor to remain reliable, a stringent constraint on the power supply voltage must be imposed. This adversely limits the full output capacity of the prior art power amplifier.

What is desired is a method and apparatus for alleviating the second order distortion, and also relieving the reliability concern.

BRIEF SUMMARY OF THIS INVENTION

In an embodiment, an apparatus includes: an input coupler configured to receive an input voltage and output a first coupled voltage and a second coupled voltage in accordance with a first bias voltage and a second bias voltage, respectively; a stacked amplifier pair configured to receive the first coupled voltage and the second coupled voltage and output a first output voltage and a second output voltage in accordance with a first DC voltage, a second DC voltage, and a third DC voltage; and an output combiner configured to establish a combined output voltage in accordance with a combination of the first output voltage and the second output voltage, wherein the stacked amplifier pair includes a first amplifier operating with a power supplied from the second DC voltage to the first DC voltage and a second amplifier operating with a power supplied from the third DC voltage to the second DC voltage. In an embodiment, the input coupler embodies an AC coupling function such that an AC value of the first coupled voltage is approximately equal to an AC value of the input voltage while a DC value of the first coupled voltage is equal to the first bias voltage, and an AC value of the second coupled voltage is approximately equal to an AC value of the input voltage while a DC value of the second coupled voltage is equal to the second bias voltage. In an embodiment, the first amplifier includes: a first active network including a gain device; and a first resonant tank including a mutually coupled inductor pair including a primary inductor and a secondary inductor. In a further embodiment, the first active network further includes a cascode device. In an embodiment, the second amplifier includes: a second active network including a gain device; and a second resonant tank including a mutually coupled inductor pair including a primary inductor and a secondary inductor. In a further embodiment, the second active network further includes a cascode device. In a further embodiment, the stacked amplifier pair further includes an inter-amplifier coupler configured to equalize a voltage at the primary inductor of the first resonant tank and a voltage at the primary inductor of the second resonant tank. In an embodiment, the inter-amplifier coupler includes a capacitor. In an embodiment, the output combiner is embodied by a serial connection of the secondary inductor of the first resonant tank and the secondary inductor of the second resonant tank. In an embodiment, the apparatus is configured to operate in a low-power mode by setting a biasing condition that substantially powers off the second amplifier, and operate in a high-power mode by setting a biasing condition that substantially powers on the second amplifier.

In an embodiment, a method includes: receiving an input voltage; coupling the input voltage into a first coupled voltage and a second coupled voltage in accordance with a first bias voltage and a second bias voltage, respectively; outputting a first output voltage and a second output voltage in accordance with the first coupled voltage and the second coupled voltage using a first amplifier and a second amplifier, respectively, wherein the first amplifier and the second amplifier are configured in a stacked topology; and establishing a combined output voltage in accordance with a combination of the first output voltage and the second output voltage. In an embodiment, an AC value of the first coupled voltage is approximately equal to an AC value of the input voltage while a DC value of the first coupled voltage is equal to the first bias voltage, and an AC value of the second coupled voltage is approximately equal to an AC value of the input voltage while a DC value of the second coupled voltage is equal to the second bias voltage. In an embodiment, the first amplifier includes: a first active network including a gain device; and a first resonant tank including a mutually coupled inductor pair including a primary inductor and a secondary inductor. In a further embodiment, the first active network further includes a cascode device. In an embodiment, the second amplifier includes: a second active network including a gain device; and a second resonant tank including a mutually coupled inductor pair including a primary inductor and a secondary inductor. In a further embodiment, the second active network further includes a cascode device. In a further embodiment, the method further includes incorporating an inter-amplifier coupler configured to equalize a voltage at the primary inductor of the first resonant tank and a voltage at the primary inductor of the second resonant tank. In an embodiment, the inter-amplifier coupler includes a capacitor. In an embodiment, the combined output voltage is established using a serial connection of the secondary inductor of the first resonant tank and the secondary inductor of the second resonant tank. In an embodiment, the method further includes setting a biasing condition that substantially powers off the second amplifier in a low-power mode, and setting a biasing condition that substantially powers on the second amplifier in a high-power mode.

DETAILED DESCRIPTION OF THIS INVENTION

The present invention relates to power amplifiers. While the specification describes several example embodiments of the invention considered favorable modes of practicing the invention, it should be understood that the invention can be implemented in many ways and is not limited to the particular examples described below or to the particular manner in which any features of such examples are implemented. In other instances, well-known details are not shown or described to avoid obscuring aspects of the invention.

Persons of ordinary skill in the art understand terms and basic concepts related to microelectronics that are used in this disclosure, such as "voltage," "signal," "single-ended," "differential," "amplifier," "bias," "gain," "capacitor," "inductor," "transformer," "resistor," "transistor," "MOS (metal-oxide semiconductor)," "PMOS (p-channel metal oxide semiconductor)," "NMOS (n-channel metal oxide semiconductor)," "AC (alternating current)," "AC couple," "DC (direct current)," "DC couple," "source," "gate," "drain," "node," "common source amplifier," "resonant tank," "serial connection," and "cascode." Those of ordinary skill in the art can also readily recognize a symbol of a MOS transistor, and its associated "source," "gate," and "drain" terminals. Terms and basic concepts like these are apparent to those of ordinary skill in the art and thus will not be explained in detail here.

Throughout this disclosure, "DC" stands for direct current, and "AC" stands for alternating current. A DC node is a node of a substantially static electric potential. A DC voltage is a voltage at a DC node. A bias voltage is a DC voltage.

Figure 1:
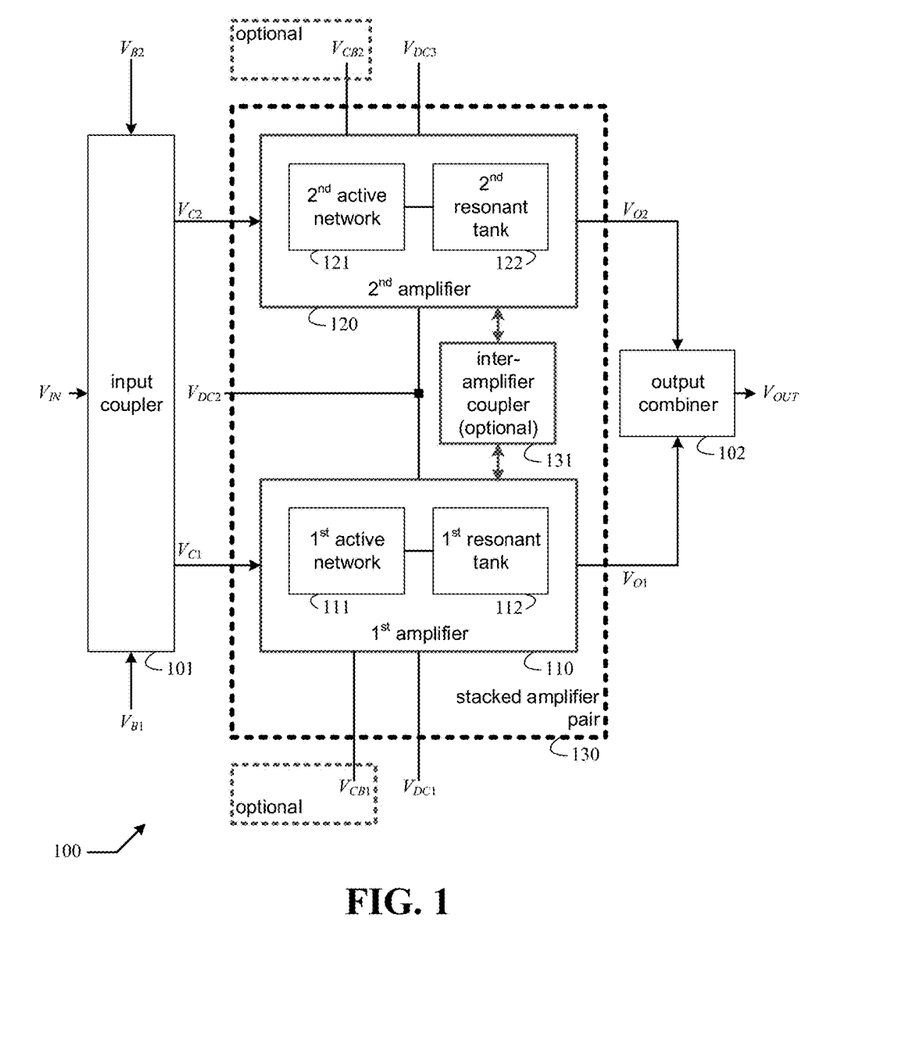
FIG. 1 shows a functional block diagram of a power amplifier in accordance with an embodiment of the present invention.

A functional block diagram of a power amplifier 100 in accordance with an embodiment of the present invention is depicted in FIG. 1. The power amplifier 100 includes: an input coupler 101 configured to receive an input voltage $V_{IN}$ and output a first coupled voltage $V_{C1}$ and a second coupled voltage $V_{C2}$ in accordance with a first bias voltage $V_{B1}$ and a second bias voltage $V_{B2}$, respectively; a stacked amplifier pair 130 configured to receive the first coupled voltage $V_{C1}$ and the second coupled voltage $V_{C2}$ and output a first output voltage $V_{O1}$ and a second output voltage $V_{O2}$ in accordance with a first DC voltage $V_{DC1}$, a second DC voltage $V_{DC2}$, and a third DC voltage $V_{DC3}$; and an output combiner 102 configured to establish a combined output voltage $V_{OUT}$ in accordance with a combination of the first output voltage $V_{O1}$ and the second output voltage $V_{O2}$. In a practical application, there is a load circuit (not shown in the figure, but apparent to those of ordinary skill in the art) configured to receive the combined output voltage $V_{OUT}$. For brevity, hereafter the input voltage $V_{IN}$ is simply referred to as $V_{IN}$, the first (second) bias voltage $V_{B1}$ ($V_{B2}$) is simply referred to as $V_{B1}$ ($V_{B2}$), the first (second) coupled voltage $V_{C1}$ ($V_{C2}$) is simply referred to as $V_{C1}$ ($V_{C2}$), the first (second, third) DC voltage $V_{DC1}$ ($V_{DC2}$, $V_{DC3}$) is simply referred to as $V_{DC1}$ ($V_{DC2}$, $V_{DC3}$) the first (second) output voltage $V_{O1}$ ($V_{O2}$) is simply referred to as $V_{O1}$ ($V_{O2}$), and the combined output voltage $V_{OUT}$ is simply referred to as $V_{OUT}$ The power amplifier 100 can be embodied by either a single-ended embodiment or a differential embodiment. In a differential embodiment, a signal, either voltage or current, is defined as a difference between a first constituent signal and a second constituent signal. For instance, a voltage signal $V_X$ is defined as $V_X \equiv V_{X+} - V_{X-}$, where $V_{X+}$ is a first constituent voltage signal and $V_{X-}$ is a second constituent voltage signal. A differential embodiment for the voltage signal $V_X$ can be constructed using a combination of two single-ended embodiments, one for the first constituent signal $V_{X+}$ and the other for the second constituent signal $V_{X-}$. Since it is apparent to those of ordinary skill in the art regarding how to construct a differential embodiment using a combination of two single-ended embodiments, for brevity only single-ended embodiments are explicitly shown in this disclosure.

The input coupler 101 is configured to fulfill an AC (alternate current) coupling function that can be mathematically described by the following two equations $$V_{C1} \cong V_{B1}(V_{IN} - \langle V_{IN} \rangle) \qquad (1)$$

$$V_{C2} \cong V_{B2}(V_{IN} - \langle V_{IN} \rangle) \qquad (2)$$

Figure 2:
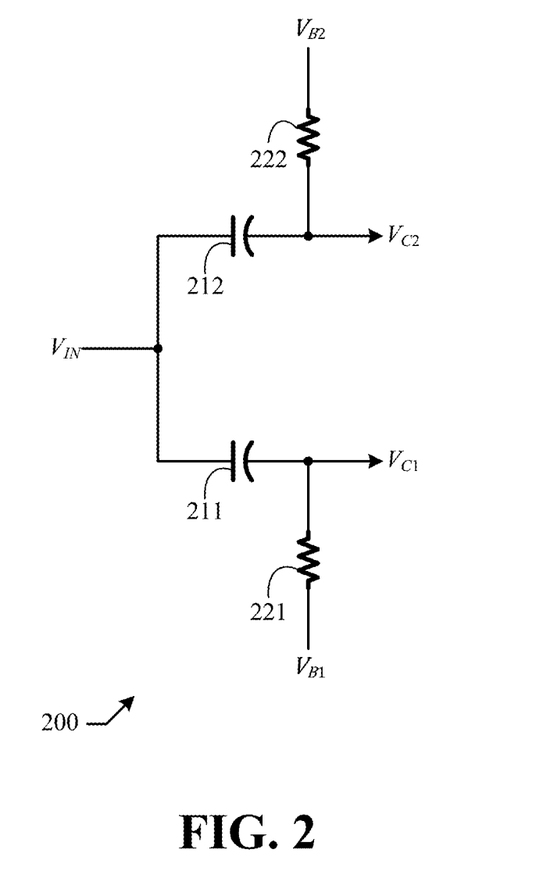
FIG. 2 shows a schematic diagram of an AC coupling network.

Here, $\langle \cdot \rangle$ denotes a time-average, and $\langle V_{IN} \rangle$ is an average of $V_{IN}$ over a sufficiently long time duration so that its value is substantially constant. A schematic diagram of an AC coupling network 200 suitable for embodying the input coupler 101 of FIG. 1 is depicted in FIG. 2. The AC coupling network 200 comprises: a first capacitor 211 configured to couple $V_{IN}$ to $V_{C1}$; a second capacitor 212 configured to couple $V_{IN}$ to $V_{C2}$; a first resistor 221 configured to couple $V_{B1}$ to $V_{C1}$; and a second resistor 222 configured to couple $V_{B2}$ to $V_{C2}$. Both $V_{B1}$ and $V_{B2}$ are substantially stationary. $V_{C1}$ and $V_{C2}$ are thus DC coupled to $V_{B1}$ and $V_{B2}$ via resistors 221 and 222, respectively, but AC coupled to $V_{IN}$ via capacitors 211 and 212, respectively. By way of example but not limitation, a frequency of interest for $V_{IN}$ is 5.5 GHz, resistors 221 and 222 are both 10K Ohm, and capacitors 211 and 212 are both 30 pF. In an alternative embodiment, one of the two resistors 221 and 222 is replaced by an inductor (not shown in figure). In a yet alternative embodiment, first capacitor 211 and resistor 221 are replaced by a first transformer (not shown in figure) configured to couple $V_{IN}$ to $V_{C1}$. In a yet another alternative embodiment, capacitor 212 and resistor 222 are replaced by a second transformer (not shown in figure) configured to couple $V_{IN}$ to $V_{C2}$. That a transformer can be used to provide an AC-coupling between a first voltage and a second voltage and at the same time set a DC value of the second voltage is well known in the prior art and thus not described in detail here.

The stacked amplifier pair 130 includes a 1$^{st}$ amplifier 110 on a lower side and a 2$^{nd}$ amplifier 120 on a higher side, wherein the 2$^{nd}$ amplifier 120 is stacked on top of the 1$^{st}$ amplifier 110. In an optional embodiment, the stacked amplifier pair 130 further includes an inter-amplifier coupler 131. The 1$^{st}$ (2$^{nd}$) amplifier 110 (120) includes a 1$^{st}$ (2$^{nd}$) active network 111 (121) and a 1$^{st}$ (2$^{nd}$) resonant tank 112

(122). Also, the 1$^{st}$ (2$^{nd}$) amplifier 110 (120) receives $V_{C1}$ ($V_{C2}$), outputs $V_{O1}$ ($V_{O2}$), and is powered by a power supplied across $V_{DC2}$ ($V_{DC3}$) and $V_{DC1}$ ($V_{DC2}$). In an optional embodiment where a cascode device is employed in the 1$^{st}$ active network 111, the 1$^{st}$ amplifier further receives a first cascode voltage $V_{CB1}$. Likewise, in an optional embodiment where a cascode device is employed in the 2$^{nd}$ active network 121, the 2$^{nd}$ amplifier further receives a second cascode voltage $V_{CB2}$. For brevity, hereafter the first (second) cascode voltage $V_{CB1}$ ($V_{CB2}$) is simply referred to as $V_{CB1}$ ($V_{CB2}$).

Figure 3A:
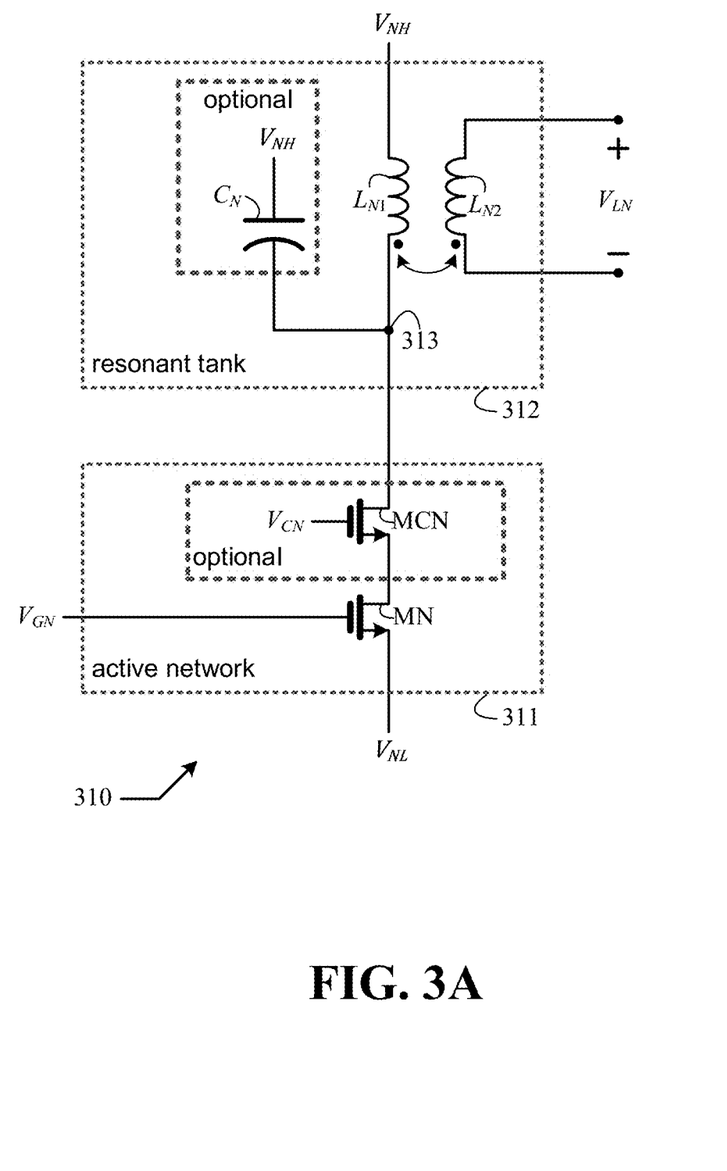
FIG. 3A shows a schematic diagram of an amplifier of a first type.

A schematic diagram of an amplifier of a first type 310 suitable for embodying either one of the 1$^{st}$ amplifier 110 and the 2$^{nd}$ amplifier 120 of FIG. 1 is shown in FIG. 3A. For brevity, hereafter the amplifier of the first type 310 depicted in FIG. 3A is simply referred to as the first type 310. The first type 310 includes: an active network 311 including a gain device embodied by an NMOS transistor MN, and a resonant tank 312 including a mutually coupled inductor pair including a primary inductor $L_{N1}$ and a secondary inductor $L_{N2}$. In an optional embodiment, the resonant tank 312 further includes a shunt capacitor $C_N$. The first type 310 receive a gate voltage $V_{GN}$ and output an induced voltage $V_{LN}$ across the secondary inductor $L_{N2}$. Here, "$V_{NH}$" denotes a high-side DC voltage, while "$V_{NL}$" denotes a low-side DC voltage. The first type 310 is a common-source radio frequency amplifier well known to those of ordinary skill in the art and thus not described in detail here. In an optional embodiment, the active network 311 further includes a cascode device embodied by another NMOS transistor MCN inserted between the drain terminal of the NMOS transistor MN and an internal node 313 and biased by a cascode voltage $V_{CN}$. The concept of incorporating a cascode device into a common-source amplifier to gain a variety of benefits (for instance, providing a better reverse isolation) is well known to those of ordinary skill in the art and thus not described in detail here. When the first type 310 is instantiated to embody the 1$^{st}$ (2$^{nd}$) amplifier 110 (120), the active network 311 embodies the 1$^{st}$ (2$^{nd}$) active network 111 (121), the resonant tank 312 embodies the 1$^{st}$ (2$^{nd}$) resonant tank 112 (122), $V_{GN}$ embodies $V_{C1}$ ($V_{C2}$), $V_{LN}$ embodies $V_{O1}$ ($V_{O2}$), $V_{NL}$ embodies $V_{DC1}$ ($V_{DC2}$), $V_{NH}$ embodies $V_{DC2}$ ($V_{DC3}$), and $V_{CN}$ embodies $V_{CB1}$ ($V_{CB2}$). By way of example but not limitation, the width and length of the NMOS transistor MN are 1000·m and 30 nm, respectively, the width and length of the NMOS transistor MCN are 1000·m and 30 nm, respectively, the primary inductor $L_{N1}$ is 400 pH, the secondary inductor $L_{N2}$ is 600 pH, the coupling coefficient between $L_{N1}$ and $L_{N2}$ is 0.9, and the shunt capacitor $C_N$ is 100 fF.

Figure 3B:
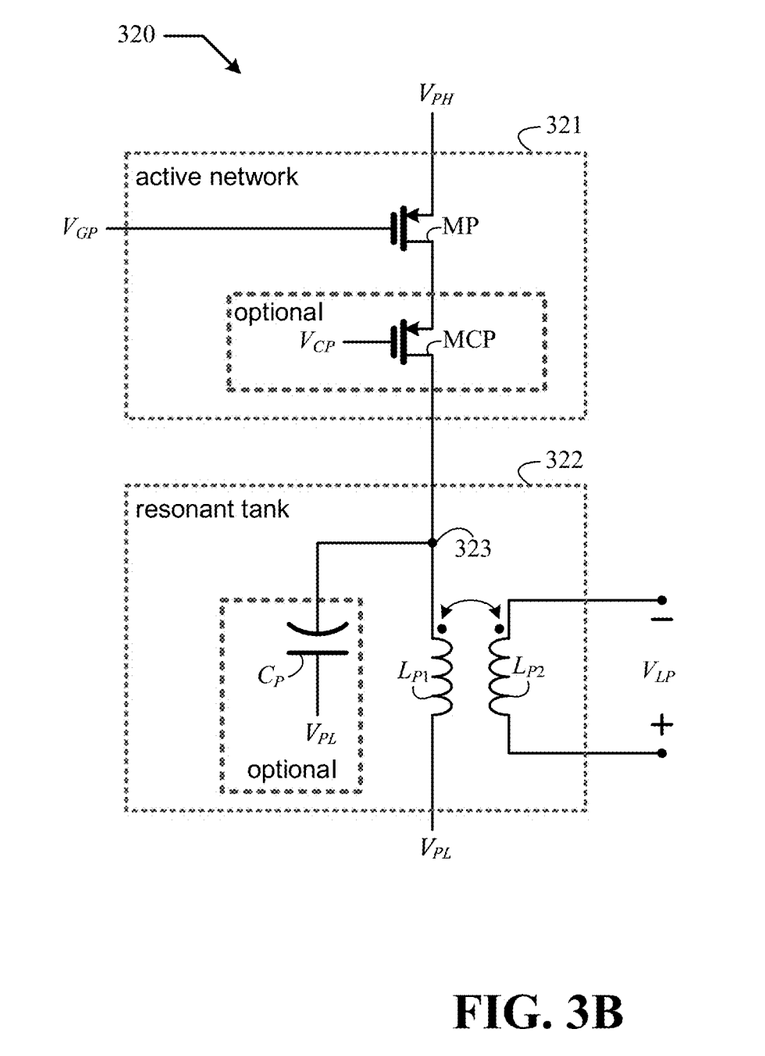
FIG. 3B shows a schematic diagram of an amplifier of a second type.

A schematic diagram of an amplifier of a second type 320 suitable for embodying either one of the 1$^{st}$ amplifier 110 and the 2$^{nd}$ amplifier 120 of FIG. 1 is shown in FIG. 3B. For brevity, hereafter the amplifier of the second type 320 depicted in FIG. 3B is simply referred to as the second type 320. The second type 320 includes: an active network 321 including a gain device embodied by a PMOS transistor MP, and a resonant tank 322 including a mutually coupled inductor pair including a primary inductor $L_{P1}$ and a secondary inductor $L_{P2}$. In an optional embodiment, the resonant tank 322 further includes a shunt capacitor $C_P$. The second type 320 receive a gate voltage $V_{GP}$ and outputs an induced voltage $V_{LP}$ across the secondary inductor $L_{P2}$. Here, "$V_{PH}$" denotes a high-side DC voltage, while "$V_{PL}$" denotes a low-side DC voltage. The second type 320 is a common-source radio frequency amplifier well known to those of ordinary skill in the art and thus not described in detail here. In another embodiment, the active network 321 further includes a cascode device embodied by another PMOS transistor MCP inserted between the drain terminal of the PMOS transistor MP and an internal node 323 and biased by a cascode voltage $V_{CP}$.

When the second type 320 is instantiated to embody the 1$^{st}$ (2$^{nd}$) amplifier 110 (120), the active network 321 embodies the 1$^{st}$ (2$^{nd}$) active network 111 (121), the resonant tank 322 embodies the 1$^{st}$ (2$^{nd}$) resonant tank 112 (122), $V_{GP}$ embodies $V_{C1}$ ($V_{C2}$), $V_{LP}$ embodies $V_{O1}$ ($V_{O2}$), $V_{PL}$ embodies $V_{DC1}$ ($V_{DC2}$), $V_{PH}$ embodies $V_{DC2}$ ($V_{DC3}$), and $V_{CP}$ embodies $V_{CB1}$ ($V_{CB2}$). By way of example but not limitation, the width and length of the PMOS transistor MP are 1200·m and 30 nm, respectively, the width and length of the PMOS transistor MCP are 1200·m and 30 nm, respectively, the primary inductor $L_{P1}$ is 400 pH, the secondary inductor $L_{P2}$ is 600 pH, the coupling coefficient between $L_{P1}$ and $L_{P2}$ is 0.9, and the shunt capacitor $C_P$ is 50 fF.

Note that the first type 310 and the second type 320 are complementary.

Now refer to FIG. 1. The 1$^{st}$ amplifier 110 can be embodied by either the first type 310 or the second type 320, and so can the 2$^{nd}$ amplifier 120. In a first embodiment, both the 1$^{st}$ amplifier 110 and the 2$^{nd}$ amplifier 120 are embodied by the first type 310. In this case, however, it must be understood that two separate copies of the first type 310, along with two different cascode voltages (i.e. "$V_{CN}$" in FIG. 3A), must be used, one for embodying the 1$^{st}$ amplifier 110 and the other for embodying the 2$^{nd}$ amplifier 120. In a second embodiment, the 1$^{st}$ amplifier 110 and the 2$^{nd}$ amplifier 120 are embodied by the second type 320 and the first type 310, respectively. In a third embodiment, the 1$^{st}$ amplifier 110 and the 2$^{nd}$ amplifier 120 are embodied by the first type 310 and the second type 320, respectively. In the second embodiment and the third embodiment, the 1$^{st}$ amplifier 110 and the 2$^{nd}$ amplifier 120 are embodied by amplifiers of complementary types. In a fourth embodiment, both the 1$^{st}$ amplifier 110 and the 2$^{nd}$ amplifier 120 are embodied by the second type 320. In this case, however, it must be understood that two separate copies of the second type 320, along with two different cascode voltages (i.e. "$V_{CP}$" in FIG. 3B), must be used, one for embodying the 1$^{st}$ amplifier 110 and the other for embodying the 2$^{nd}$ amplifier 120.

The optional inter-amplifier coupler 131 is useful when the 1$^{st}$ amplifier 110 and the 2$^{nd}$ amplifier 120 are embodied by amplifiers of complementary types. In this case, the optional inter-amplifier coupler 131 can be configured to make the 1$^{st}$ amplifier 110 and the 2$^{nd}$ amplifier complement each other thus canceling a second order distortion (since PMOS transistor and NMOS transistor have opposite second order distortion). In an embodiment, the inter-amplifier coupler 131 includes an inter-amplifier capacitor configured to provide a capacitive coupling between a drain voltage of the 1$^{st}$ active network 111 and a drain voltage of the 2$^{nd}$ active network 121. When the first type 310 is used to embody the 1$^{st}$ (2$^{nd}$) amplifier 110 (120), the drain voltage of the 1$^{st}$ (2$^{nd}$) active network 111 (121) refers to the voltage at the internal node 313 of FIG. 3A. When the second type 320 is used to embody the 1$^{st}$ (2$^{nd}$) amplifier 110 (120), the drain voltage of the 1$^{st}$ (2$^{nd}$) active network 111 (121) refers to the voltage at the internal node 323 of FIG. 3B. In an alternative embodiment, the inter-amplifier coupler 131 is not embodied by an explicit circuit but instead by a deliberate inductive coupling between the 1$^{st}$ resonant tank 112 and the 2$^{nd}$ resonant tank 122. A deliberate inductive coupling can be realized by, for instance, laying out the primary inductor of the 1$^{st}$ resonant tank 112 and the primary inductor of the $2^{nd}$ resonant tank 122 in a stack configuration or an interdigitated configuration. The concept of inductive coupling is known to those of ordinary skill in the art and thus not described in detail here.

In an embodiment, the output combiner 102 is embodied by a serial connection of the secondary inductor of the $1^{st}$ resonant tank 112 and the secondary inductor of the $2^{nd}$ resonant tank 122, so that $V_{OUT}$ is a sum of $V_{O1}$ and $V_{O2}$. In an alternative embodiment, the output combiner 102 embodied by a parallel connection of the secondary inductor of the $1^{st}$ resonant tank 112 and the secondary inductor of the $2^{nd}$ resonant tank 122, so that $V_{O1}$ is equalized with $V_{O2}$, and consequently equal to $V_{OUT}$. This alternative embodiment might be useful when the power amplifier 100 needs to drive a low impedance load. In either embodiment, an output power of the $1^{st}$ amplifier 110 and an output power of the $2^{nd}$ amplifier 120 can be effectively summed.

The power amplifier 100 can be configured to operate at either at high-power mode or a low-power mode. When operating in the high-power mode, both the $1^{st}$ amplifier 110 and the $2^{nd}$ amplifier 120 are substantially powered on. When operating in the low-power mode, the $1^{st}$ amplifier 110 is substantially powered on while the $2^{nd}$ amplifier is substantially powered off. To substantially power on the $1^{st}$ amplifier 110, $V_{B1}$ and $V_{CB1}$, if applicable, must be set to be sufficiently high (low) when the $1^{st}$ amplifier 110 is embodied by the first (second) type 310 (320). Likewise, to substantially power on the $2^{nd}$ amplifier 120, $V_{B2}$ and $V_{CB2}$, if applicable, must be set to be sufficiently high (low) when the $2^{nd}$ amplifier 120 is embodied by the first (second) type 310 (320). In an embodiment, by way of example but not limitation: $V_{DC1}$ is 0V; $V_{DC2}$ is 1.5V; $V_{DC2}$ is 3V; the $1^{st}$ amplifier 110 is embodied by the second type 320 with the cascode option; $V_{B1}$ is 0.8V; $V_{CB1}$ is 0.3V; the $2^{nd}$ amplifier 120 is embodied by the first type 310 with the cascode option; $V_{B2}$ is 2.2V; $V_{CB2}$ is 2.7V in the high-power mode but is 1.7V in the low-power mode. This way, the power amplifier 100 is configured to operate in either the high-power mode or the low-power mode in accordance with a setting of $V_{CB2}$. In another embodiment: $V_{DC1}$ is 0V; $V_{DC2}$ is 0.8V; $V_{DC3}$ is 1.6V; the $1^{st}$ amplifier 110 is embodied by the second type 320 without the cascode option; $V_{B1}$ is 0.2V; the $2^{nd}$ amplifier 120 is embodied by the first type 310 without the cascode option; $V_{B2}$ is 1.4V in the high-power mode but is 0.8V in the low-power mode. This way, the power amplifier 100 is configured to operate in either the high-power mode or the low-power mode in accordance with a setting of the second bias voltage $V_{B2}$. In either embodiment, the power 100 is configured to operate in either the high-power mode or the low-power mode in accordance with a setting of a biasing condition of the $2^{nd}$ amplifier 120, which is the upper side amplifier of the stacked amplifier pair 130.

In an alternative embodiment, the power amplifier 100 can be configured to operate at either at high-power mode or a low-power mode in accordance with a setting of the three DC voltages $V_{DC1}$, $V_{DC2}$, and $V_{DC3}$. In the high-power mode, $V_{DC2}$ is set to be substantially higher than $V_{DC1}$, and $V_{DC3}$ is set to be substantially higher than $V_{DC2}$. In the low-power mode, either one of the following two embodiments can be used: (1) $V_{DC2}$ is set to be substantially higher than $V_{DC1}$, but $V_{DC3}$ is set to be not substantially different from $V_{DC2}$ (2) $V_{DC3}$ is set to be substantially higher than $V_{DC2}$, but $V_{DC2}$ is set to be not substantially different from $V_{DC1}$.

In any case, embodiments of the present invention allow a high degree of freedom for configuring the power amplifier 100 thanks to using the stacked amplifier pair topology.

Figure 4:
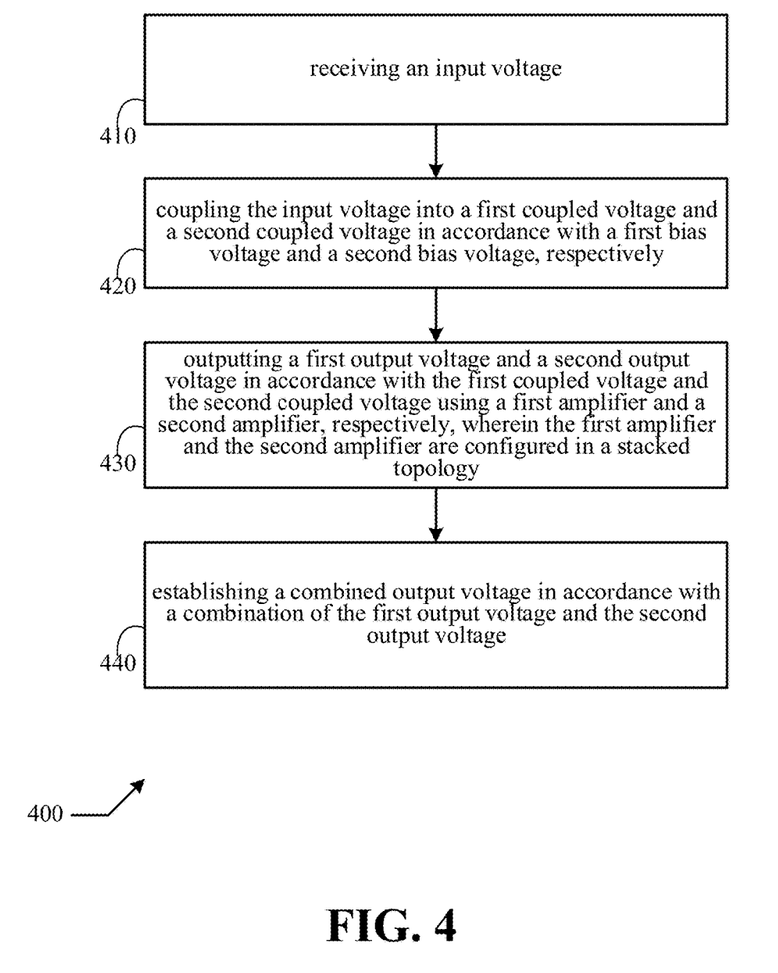
FIG. 4 shows a flow diagram of a method in accordance with the present invention.

As depicted in a flow diagram 400 depicted in FIG. 4, a method in accordance with an embodiment of the present invention includes: (step 410) receiving an input voltage; (step 420) coupling the input voltage into a first coupled voltage and a second coupled voltage in accordance with a first bias voltage and a second bias voltage, respectively; (step 430) outputting a first output voltage and a second output voltage in accordance with the first coupled voltage and the second coupled voltage using a first amplifier and a second amplifier, respectively, wherein the first amplifier and the second amplifier are configured in a stacked topology; and (step 440) establishing a combined output voltage in accordance with a combination of the first output voltage and the second output voltage.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An apparatus comprising:
   an input coupler configured to receive an input voltage and output a first coupled voltage and a second coupled voltage in accordance with a first bias voltage and a second bias voltage, respectively, wherein the first bias voltage and the second bias voltage are provided on input lines that are separately provided to the input coupler;
   a stacked amplifier pair configured to receive the first coupled voltage and the second coupled voltage and output a first output voltage and a second output voltage in accordance with a first DC (direct current) voltage, a second DC voltage, and a third DC voltage; and
   an output combiner configured to establish a combined output voltage in accordance with a combination of the first output voltage and the second output voltage, wherein the stacked amplifier pair includes a first amplifier operating with a power supplied from the second DC voltage to the first DC voltage and a second amplifier operating with a power supplied from the third DC voltage to the second DC voltage.

2. The apparatus of claim 1, wherein the input coupler embodies an AC (alternating current) coupling function such that an AC value of the first coupled voltage is approximately equal to an AC value of the input voltage while a DC value of the first coupled voltage is equal to the first bias voltage, and an AC value of the second coupled voltage is approximately equal to an AC value of the input voltage while a DC value of the second coupled voltage is equal to the second bias voltage.

3. The apparatus of claim 1, wherein the first amplifier includes: a first active network including a gain device; and a first resonant tank including a mutually coupled inductor pair including a primary inductor and a secondary inductor.

4. The apparatus of claim 3, wherein the first active network further includes a cascode device.

5. The apparatus of claim 3, wherein the second amplifier includes: a second active network including a gain device; and a second resonant tank including a mutually coupled inductor pair including a primary inductor and a secondary inductor.

6. The apparatus of claim 5, wherein the second active network further includes a cascode device.

7. The apparatus of claim 6, the stacked amplifier pair further includes an inter-amplifier coupler configured to equalize a voltage at the primary inductor of the first resonant tank and a voltage at the primary inductor of the second resonant tank.

8. The apparatus of claim 7, wherein the inter-amplifier coupler includes a capacitor.

9. The apparatus of claim 7, wherein the output combiner is embodied by a serial connection of the secondary inductor of the first resonant tank and the secondary inductor of the second resonant tank.

10. The apparatus of claim 1, wherein the apparatus is configured to operate in a low-power mode by setting a biasing condition that substantially powers off the second amplifier, and operate in a high-power mode by setting a biasing condition that substantially powers on the second amplifier.

11. A method comprising:
receiving an input voltage;
coupling the input voltage into a first coupled voltage and a second coupled voltage in accordance with a first bias voltage and a second bias voltage, respectively, wherein the first bias voltage and the second bias voltage are provided on input lines that are separately provided to an input coupler;
outputting a first output voltage and a second output voltage in accordance with the first coupled voltage and the second coupled voltage using a first amplifier and a second amplifier, respectively, wherein the first amplifier and the second amplifier are configured in a stacked topology; and
establishing a combined output voltage in accordance with a combination of the first output voltage and the second output voltage.

12. The method of claim 11, wherein the coupling operation utilizes an AC (alternating current) coupling function such that an AC value of the first coupled voltage is approximately equal to an AC value of the input voltage while a DC value of the first coupled voltage is equal to the first bias voltage, and an AC value of the second coupled voltage is approximately equal to an AC value of the input voltage while a DC value of the second coupled voltage is equal to the second bias voltage.

13. The method of claim 11, wherein the first amplifier includes: a first active network including a gain device; and a first resonant tank including a mutually coupled inductor pair including a primary inductor and a secondary inductor.

14. The method of claim 13, wherein the first active network further includes a cascode device.

15. The method of claim 13, wherein the second amplifier includes: a second active network including a gain device; and a second resonant tank including a mutually coupled inductor pair including a primary inductor and a secondary inductor.

16. The method of claim 15, wherein the second active network further includes a cascode device.

17. The method of claim 16, the stacked amplifier pair further includes an inter-amplifier coupler configured to equalize a voltage at the primary inductor of the first resonant tank and a voltage at the primary inductor of the second resonant tank.

18. The method of claim 17, wherein the inter-amplifier coupler includes a capacitor.

19. The method of claim 17, wherein the establishing a combined output voltage operation utilizes a serial connection of the secondary inductor of the first resonant tank and the secondary inductor of the second resonant tank.

20. The method of claim 11, wherein the method further includes setting a biasing condition that substantially powers off the second amplifier in a low-power mode, and setting a biasing condition that substantially powers on the second amplifier in a high-power mode.

* * * * *